(12) United States Patent
Izuta (10) Patent No.: US 8,153,017 B2
(45) Date of Patent: Apr. 10, 2012

(54) SUBSTRATE TREATING METHOD

(75) Inventor: Takashi Izuta, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 313 days.

(21) Appl. No.: 12/194,218

(22) Filed: Aug. 19, 2008

(65) Prior Publication Data

US 2008/0308530 A1 Dec. 18, 2008

Related U.S. Application Data

(63) Continuation of application No. 10/746,798, filed on Dec. 24, 2003, now abandoned.

(30) Foreign Application Priority Data

| Dec. 26, 2002 | (JP) | ................................. | 2002-377535 |
| May 29, 2003 | (JP) | ................................. | 2003-152642 |
| Nov. 14, 2003 | (JP) | ................................. | 2003-384953 |

(51) Int. Cl.
*B44C 1/22* (2006.01)
*C23F 1/00* (2006.01)
*C03C 15/00* (2006.01)
*C03C 25/68* (2006.01)

(52) U.S. Cl. .......................................... 216/84; 438/745
(58) Field of Classification Search ................... 216/84; 438/745
See application file for complete search history.

(56) References Cited

U.S. PATENT DOCUMENTS

| 6,758,940 B2 | 7/2004 | Chiu |
| 6,780,277 B2 | 8/2004 | Yokomizo et al. |
| 2004/0140365 A1 | 7/2004 | Izuta |
| 2005/0011537 A1 | 1/2005 | Toshima et al. |

FOREIGN PATENT DOCUMENTS

| JP | 09-181041 | 7/1997 |
| JP | 11-154665 | 6/1999 |
| JP | 11-219931 | 8/1999 |

OTHER PUBLICATIONS

English Translation of JP11-154665 dated Jun. 8, 1999.
MSDS of phosphoric acid.

*Primary Examiner* — Roberts Culbert
(74) *Attorney, Agent, or Firm* — Ostrolenk Faber LLP (57) ABSTRACT

A substrate treating apparatus for heating a treating solution formed of a chemical and a diluent, and immersing substrates in the treating solution for treatment. The apparatus includes a treating tank for storing the treating solution, a heater for heating the treating solution, a temperature detector for detecting temperature of the treating solution, a temperature controller for controlling the heater so that a detected temperature of the treating solution reaches a set temperature, a supplementing device for supplement the treating tank with the diluent, a concentration detector for detecting concentration of the treating solution, and a concentration controller, operable only when the temperature detector detects the treating solution being in a temperature range close to the set temperature, for controlling the supplementing device to adjust an amount of the diluent supplemented so that the concentration of the treating solution detected by the concentration detector becomes slightly higher than a boiling-point concentration corresponding to the set temperature of the treating solution.

5 Claims, 8 Drawing Sheets

Fig.8 flow rate characteristic diagram

SUBSTRATE TREATING METHOD

CROSS-REFERENCE TO RELATED APPLICATIONS

The present application is a Continuation Application of U.S. Ser. No. 10/746,798 filed Dec. 24, 2003, which application claims the benefit and priority of JP2002-377535 filed Dec. 26, 2002, JP2003-152642 filed May 29, 2003, JP2003-384953 filed Nov. 14, 2003, incorporated by reference.

BACKGROUND OF THE INVENTION (1) Field of the Invention

This invention relates to a substrate treating apparatus for treating, with a treating solution, substrates such as semiconductor wafers, glass substrates for liquid crystal displays, glass substrates for photomasks and the like (hereinafter called simply "substrates").

(2) Description of the Related Art

Known apparatus of this type include, for example, an apparatus for etching a silicon nitride film on substrate surfaces with a high-temperature phosphoric acid solution ($H_3PO_4$) (see Japanese Unexamined Patent Publication No. 9-181041 (1997), page 3 and FIG. 1, for example).

The concentration of the solution may be controlled simultaneously with and independently of its temperature (see Japanese Unexamined Patent Publication No. 11-154665 (1999), paragraphs [0015] to [0017] and FIG. 1, for example).

Figure 1:
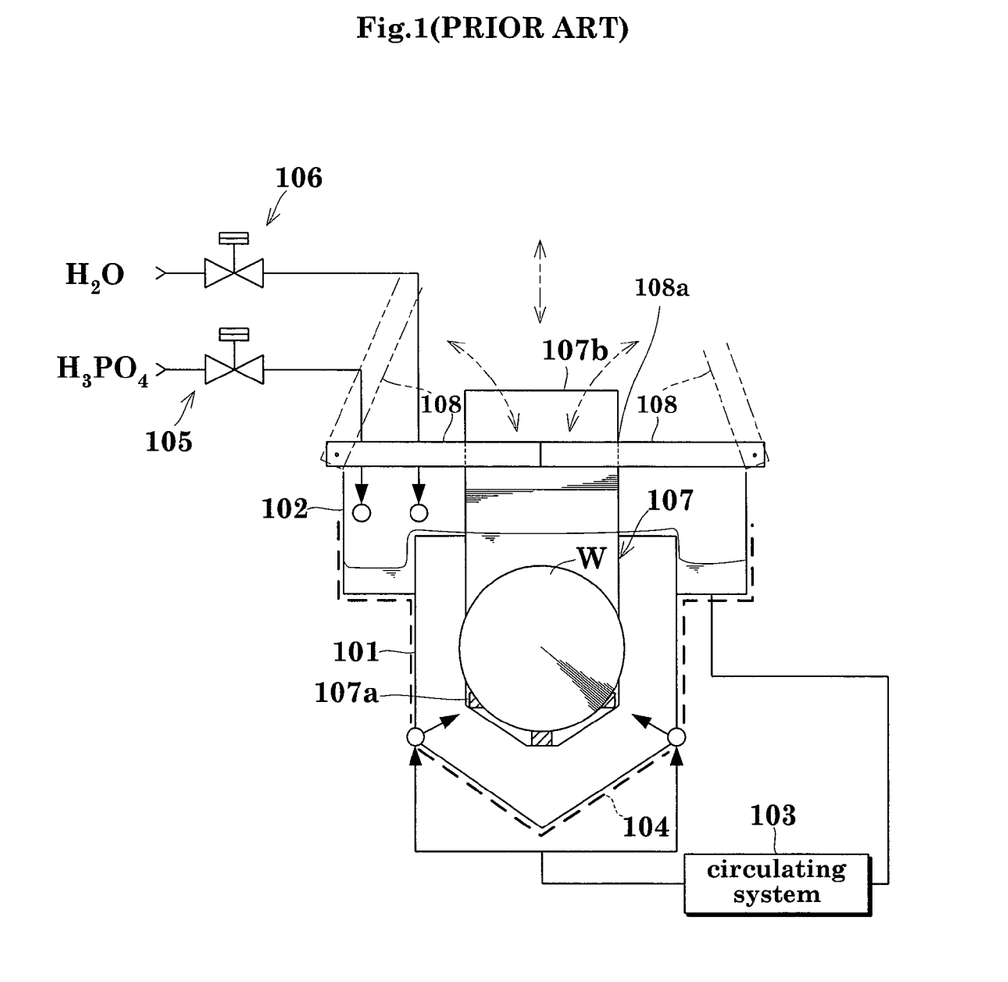
FIG. 1 is an explanatory view of a conventional apparatus.

A known apparatus will be described hereinafter with reference to FIG. 1. This apparatus includes a treating tank 101 for storing a phosphoric acid solution, a collecting tank 102 for collecting the phosphoric acid solution overflowing the treating tank 101, a circulating system 103 for returning the phosphoric acid solution collected in the collecting tank 102 to the treating tank 101, a heater 104 for constantly heating the phosphoric acid solution in the treating tank 101, a phosphoric acid supply device 105, and a supplementing device 106 for supplementing the treating tank 101 with deionized water for controlling the temperature of the phosphoric acid solution.

In order to maintain a high etching rate for silicon oxide film, the phosphoric acid solution adjusted to a predetermined concentration is maintained at a high temperature (120 to 170° C.) just below a boiling point corresponding to that concentration. When the phosphoric acid solution is above the predetermined temperature, the solution is cooled by supplying deionized water from the supplementing device 106 into the treating tank 101. Conversely, when the phosphoric acid solution is below the predetermined temperature, the solution is heated by the heater 104 without supplementing deionized water.

Wafers W to undergo etching treatment are placed in the treating tank 101 as arranged in vertical posture and equidistantly on a horizontal guide 107a of an approximately L-shaped holding arm 107. The treating tank 101 has an openable cover 108 for covering an upper opening thereof through which the group of wafers W held by the holding arm 107 is loaded into and unloaded from the tank 101. The cover 108 is closed when the holding arm 107 is outside the treating tank 101. The cover 108 is opened for allowing the group of wafers W to be loaded into the treating tank 101. After the group of wafers W is loaded into the treating tank 101, the cover 108 is closed again and etching treatment is carried out in the state shown in FIG. 1. In this state, a suspension arm 107b of the holding arm 107 extends out of the tank 101 through an opening 108a formed in the cover 108.

The conventional apparatus described above has the following drawback.

When the group of wafers W in a "lot-out" state outside the treating tank 101 is moved to a "lot-in" state inside the treating tank 101, the concentration of the phosphoric acid solution in the treating tank 101 undergoes a marked change. Such a change in the concentration of the phosphoric acid solution lowers the quality of etching treatment. Further, the lot-in state may entail a sudden boiling (bumping) of the phosphoric acid solution. The bumping of the phosphoric acid solution results in violent movements thereof, which vibrate and adversely influence the wafers W.

The method of controlling concentration and temperature simultaneously with and independently of each other can easily control the concentration with high precision when there is no disturbance and the temperature is stable. However, since the temperature is seldom maintained stable, this method has the problem of taking a long time for the concentration to reach a set value.

Such a problem will be described by referring to a specific example of variations in the temperature and concentration (specific gravity) shown in FIG. 2.

Figure 2A:
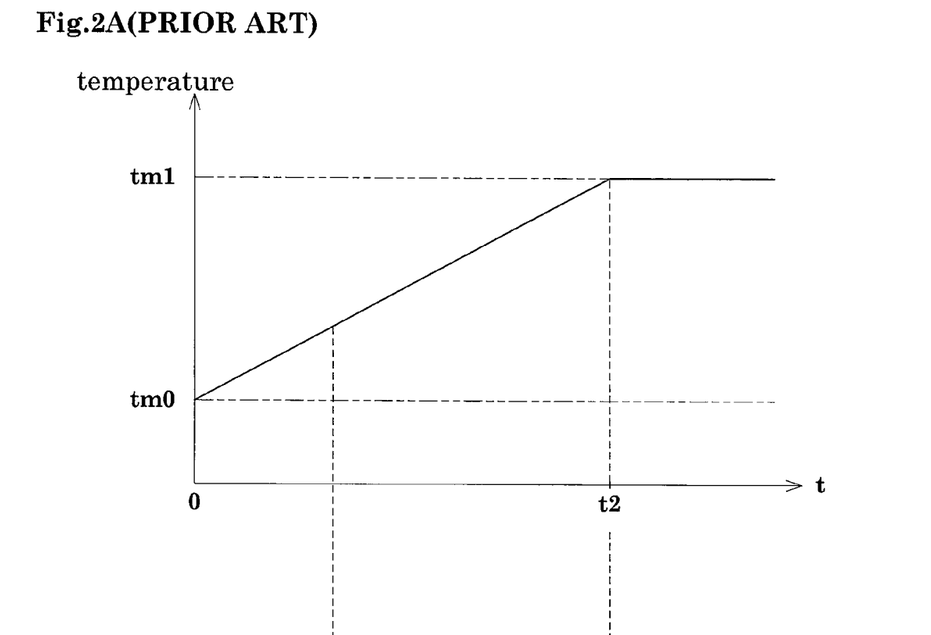
FIG. 2A shows temperature variations and FIG. 2B shows concentration variations.
Figure 2B:
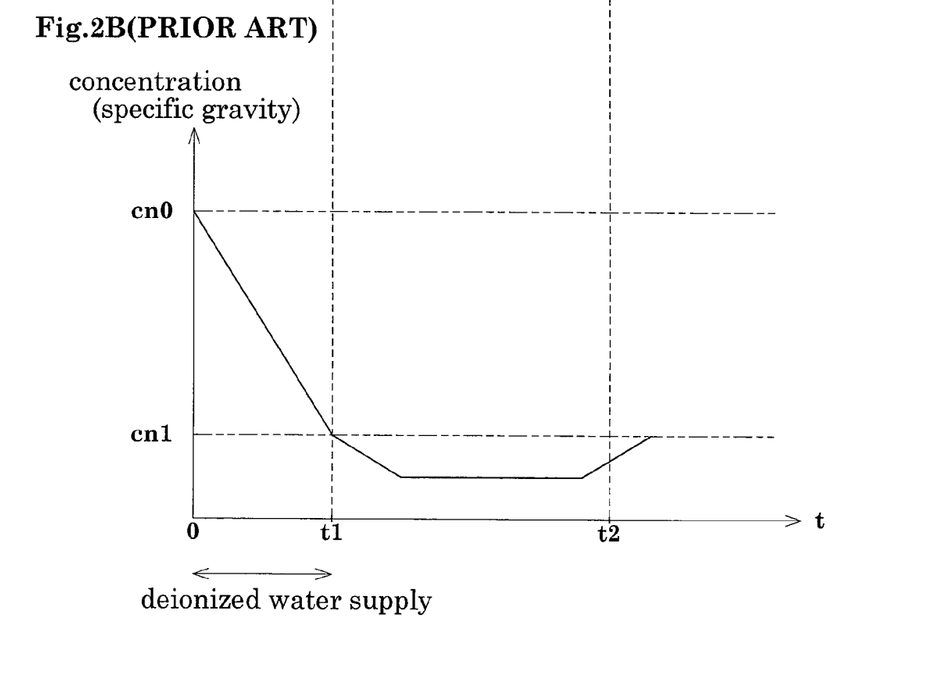

In this example, as shown in FIG. 2A, heating is started at time t=0 to increase temperature from tm0 toward a set temperature tm1. In parallel therewith, as shown in FIG. 2B, concentration is controlled from cn0 toward a set concentration cn1, and deionized water is supplied for this purpose. Then, the concentration is lowered by the deionized water supply and heating. While heating is continued to increase the temperature toward the set temperature tm1, the concentration falls below the set concentration cn1 once before the temperature reaches the set temperature tm1. The concentration reaches the set concentration cn1 after time t2 when the temperature reaches the set temperature tm1. That is, by controlling the temperature and concentration simultaneously, the concentration undergoes variations under the influence of the temperature. The variations in the concentration are greatly influenced also by the deionized water supplied for concentration control. This results in the problem noted above.

In the above apparatus, the supplementing device or switch valve 106 can take either an open position or a closed position.

Thus, the time of the switch valve 106 being kept open is adjusted to control an amount of deionized water supplemented. It is difficult for the conventional apparatus to supply an accurately adjusted amount of deionized water.

In the above conventional example, in order to maintain a high etching rate, the phosphoric acid solution adjusted to a predetermined concentration is maintained at a high temperature just below the boiling point corresponding to that concentration. The problem noted above occurs also with a different type of substrate treating apparatus in which the switch valve 106 is operated to supplement deionized water or other diluent for a chemical solution to the treating tank 101.

SUMMARY OF THE INVENTION

This invention has been made having regard to the state of the art noted above, and its object is to provide a substrate treating apparatus for maintaining a treating solution in a treating tank at a fixed concentration to preclude the possibility of bumping of the treating solution, and for controlling the concentration in a relatively short time.

Another object of this invention is to provide a substrate treating apparatus constructed for linearly adjusting a flow rate of a diluent to adjust, with high precision, an amount of the diluent supplemented.

To solve the above-noted problem of the prior art, Inventor has made intensive research and attained the following findings.

The cover 108 is closed when the group of wafers W is outside the tank (in the lot-out state). Since the holding arm 107 is above the cover 108, the opening 108a of the cover 108 remains open. Consequently, part of the heat of the phosphoric acid solution in the treating tank 101 escapes through the opening 108a. The heater 104 is adjusted so that, in this lot-out state, the phosphoric acid solution in the treating tank 101 is maintained at the high temperature just below the boiling point, and is thermally balanced.

Next, when the group of wafers W is loaded into the tank (lot-in state), the cover 108 is closed as in time of the lot-out state. Since the suspension arm 107b of the holding arm 107 extends outward through the opening 108a of the cover 108, the opening 108a is stopped up by the arm 107b. Consequently, the heat of the phosphoric acid solution which escaped outside through this opening 108a in time of the lot-out state now loses its outlet. That is, the thermal balance in the treating tank 101 is lost to raise the temperature-sustaining effect. As a result, the temperature of the phosphoric acid solution increases sharply. This temperature increase is detected by a temperature detector not shown, whereupon deionized water is supplemented from the supplementing device 106 into the tank, thereby lowering the temperature of the phosphoric acid solution. The deionized water supplemented lowers the concentration of the phosphoric acid solution to cause concentration variations. When the concentration of the phosphoric acid solution lowers, the boiling point corresponding to the concentration will also fall sharply. As a result of the boiling point falling below the temperature of the phosphoric acid solution in the tank, bumping of the phosphoric acid solution takes place although the temperature is lowered by the supplement of deionized water.

Regarding the concentration control, it has been found that, rather than controlling concentration simultaneously with temperature, a concentration control carried out after bringing the temperature into a fixed range including the set temperature can attain the set value of concentration within a shorter time than in the prior art.

Based on the above findings, this invention provides a substrate treating apparatus for heating a treating solution formed of a chemical and a diluent, and immersing substrates in the treating solution for treatment, comprising:

a treating tank for storing the treating solution;

a heating device for heating the treating solution;

a temperature detecting device for detecting temperature of the treating solution;

a temperature control device for controlling the heating device so that a detected temperature of the treating solution reaches a set temperature;

a supplementing device for supplement the treating tank with the diluent;

a concentration detecting device for detecting concentration of the treating solution; and a concentration control device, operable only when the temperature detecting device detects the treating solution being in a temperature range close to the set temperature, for controlling the supplementing device to adjust an amount of the diluent supplemented so that the concentration of the treating solution detected by the concentration detecting device becomes slightly higher than a boiling-point concentration corresponding to the set temperature of the treating solution.

The temperature control of the treating solution and the concentration control of the treating solution are performed independently of each other. When, for example, a temperature increase occurs for some reason to the treating solution in the treating tank with substrates placed therein, the temperature control device controls the heating device to suppress the temperature increase of the treating solution. That is, this apparatus does not resort to the temperature control practiced in the prior art in which the temperature of the treating solution is lowered by supplementing diluent water. The temperature control of the treating solution does not result in variations in the concentration of the treating solution. This precludes the possibility of bumping of the treating solution. Further, the concentration control device controls the supplementing device to adjust an amount of the diluent supplemented so that the detected concentration of the treating solution becomes slightly higher than a boiling-point concentration corresponding to the set temperature of the treating solution. This is effective for maintaining a high etching rate of the treating solution. Furthermore, a concentration control performed when the temperature of the treating solution is far from the set temperature could cause bumping due to lowering of the concentration of the treating solution. It is necessary to be aware of the range of concentration variations. However, the concentration control device of this invention performs the concentration control only when the treating solution is in a temperature range close to the set temperature. This requires only the boiling-point concentration corresponding to the set temperature to be taken into consideration, which further reduces the possibility of bumping. In addition, concentration and temperature may be controlled in a relatively short time.

In this invention, preferably, the apparatus comprises a collecting tank for collecting the treating solution overflowing the treating tank, and a circulating system for returning the treating solution collected in the collecting tank to the treating tank.

The apparatus further comprising such a collecting tank and a circulating system has the advantage of promoting use efficiency of the treating solution.

The heating device, preferably, includes a tank heater attached to the treating tank for heating the treating solution in the treating tank, and a circulating system heater for heating the treating solution circulating through the circulating system.

This construction further promotes use efficiency of the treating solution.

Preferably, the concentration detecting device is arranged to detect the concentration of the treating solution by substantially detecting specific gravity of the treating solution.

This construction can detect the concentration of the treating solution relatively easily.

Preferably, the concentration detecting device has a detecting element disposed at a predetermined depth in the treating tank for detecting a pressure of the treating solution applied to the detecting element.

The pressure of the treating solution at a predetermined depth in the treating tank is proportional to the specific gravity of the treating solution. Thus, the specific gravity of the treating solution may be determined by detecting the pressure of the treating solution, and the concentration of the treating solution may be known from the specific gravity.

Preferably, the concentration control device is arranged to supplement the diluent when a detected concentration of the treating solution exceeds a target concentration, and stop supplementing the diluent when the detected concentration of the treating solution is less than the target concentration.

With this construction, the concentration of the treating solution is lowered by supplementing the diluent. When the supplementing of the diluent is stopped, the concentration of the treating solution is automatically increased by evaporation of the diluent from the treating solution heated. Thus, the concentration of the treating solution is easily maintained at the target concentration.

Preferably, the treating solution is a phosphoric acid solution formed of phosphoric acid acting as the chemical and deionized water acting as the diluent.

Since a phosphoric acid solution of fixed concentration may be maintained at a temperature close to the boiling point, nitride film or the like may be treated at a high etching rate.

In another aspect of the invention, a substrate treating apparatus for heating a treating solution formed of a chemical and a diluent, and immersing substrates in the treating solution for treatment, comprises:

a treating tank for storing the treating solution;

a heating device for heating the treating solution;

piping including an air control valve for supplementing the diluent to the treating solution heated by the heating device;

an electropneumatic converter for applying an output pressure to the air control valve;

a concentration detecting device for detecting concentration of the treating solution; and a concentration control device operable based on a result of detection by the concentration detecting device, for adjusting the output pressure of the electropneumatic converter to control the air control valve and adjust an amount of the diluent supplemented.

In this invention, the temperature control of the treating solution and the concentration control of the treating solution are performed independently of each other. When, for example, a temperature increase occurs for some reason to the treating solution in the treating tank with substrates placed therein, the heating device is controlled to suppress the temperature increase of the treating solution. That is, this apparatus does not resort to the temperature control practiced in the prior art in which the temperature of the treating solution is lowered by supplementing diluent water. The temperature control of the treating solution does not result in variations in the concentration of the treating solution. The concentration control device, based on a result of detection by the concentration detecting device, adjusts the output pressure of the electropneumatic converter to control the air control valve and adjust an amount of diluent supplemented. The electropneumatic converter can vary the output pressure linearly according to an electric signal, and operate the air control valve based on the electric signal. As a result, the amount of diluent supplemented may be adjusted linearly in response to the output pressure from the electropneumatic converter to the air control valve. Thus, the diluent may be supplemented accurately according to the detected concentration.

Preferably, the apparatus comprises a temperature detecting device for detecting temperature of the treating solution, and a temperature control device for controlling the heating device so that a detected temperature of the treating solution reaches a set temperature, wherein the concentration control device is arranged to adjust the output pressure of the electropneumatic converter so that the concentration of the treating solution detected by the concentration detecting device becomes slightly higher than a boiling-point concentration corresponding to the set temperature of the treating solution.

The concentration control device controls the amount of diluent supplemented by controlling the electropneumatic converter so that the detected concentration of the treating solution becomes slightly higher than a boiling-point concentration corresponding to the set temperature of the treating solution. This is effective to maintain a high etching rate of the treating solution accurately.

In the conventional apparatus shown in FIG. 1, when treatment is performed with the phosphoric acid solution adjusted to a predetermined concentration and maintained at a high temperature (120 to 170° C.) just below a boiling point corresponding to that concentration, wafers W to undergo etching treatment are placed in the treating tank 101 as arranged in vertical posture and equidistantly on the horizontal guide 107a of the approximately L-shaped holding arm 107. The treating tank 101 has an openable cover 108 for covering an upper opening thereof through which the group of wafers W held by the holding arm 107 is loaded into and unloaded from the tank 101. The cover 108 is closed when the holding arm 107 is outside the treating tank 101. The cover 108 is opened for allowing the group of wafers W to be loaded into the treating tank 101. After the group of wafers W is loaded into the treating tank 101, the cover 108 is closed again and etching treatment is carried out in the state shown in FIG. 1. In this state, the suspension arm 107b of the holding arm 107 extends out of the tank 101 through the opening 108a formed in the cover 108.

With the conventional apparatus having the above construction, when the group of wafers W in a "lot-out" state outside the treating tank 101 is moved to a "lot-in" state inside the treating tank 101, the concentration of the phosphoric acid solution in the treating tank 101 undergoes a marked change. Such a change in the concentration of the phosphoric acid solution lowers the quality of etching treatment. Further, the lot-in state may entail a sudden boiling (bumping) of the phosphoric acid solution. The bumping of the phosphoric acid solution results in violent movements thereof, which vibrate and adversely influence the wafers W on the horizontal guide 107a.

As noted in the foregoing description of the result of the research, the above inconvenience is caused by the loss of the thermal balance in times of the lot-out state and lot-in state, which raises the temperature-sustaining effect to increase the temperature of the phosphoric acid solution rapidly.

The additional features of this invention noted hereinbefore allow the treating solution in the treating tank to be accurately maintained constant to preclude the possibility of bumping.

Preferably, the apparatus further comprises a temperature detecting device for detecting temperature of the treating solution, and a temperature control device for controlling the heating device so that a detected temperature of the treating solution reaches a set temperature, wherein the concentration control device is operable only when the treating solution is in a temperature range close to the set temperature.

A concentration control performed when the temperature of the treating solution is far from the set temperature could cause bumping due to lowering of the concentration of the treating solution. It is necessary to be aware of the range of concentration variations. In the above construction, however, the concentration control is carried out only when the treating solution is in a temperature range close to the set temperature. This requires only the boiling-point concentration corresponding to the set temperature to be taken into consideration, which further reduces the possibility of bumping.

Preferably, the concentration control device is arranged to supplement the diluent when a detected concentration of the treating solution exceeds a target concentration, and stop supplementing the diluent when the detected concentration of the treating solution is less than the target concentration.

With this construction, the concentration of the treating solution is lowered by supplementing the diluent. When the supplementing of the diluent is stopped, the concentration of the treating solution is automatically increased by evaporation of the diluent from the treating solution heated. Thus, the concentration of the treating solution is easily maintained at the target concentration.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2 is a graph showing a specific example of variations in temperature and concentration (specific gravity) occurring with a conventional control, in which

FIG. 6 is a graph showing a specific example of variations in temperature and concentration (specific gravity), in which

DESCRIPTION OF THE PREFERRED EMBODIMENTS

Preferred embodiments of this invention will be described in detail hereinafter with reference to the drawings.

Embodiment 1

Figure 3:
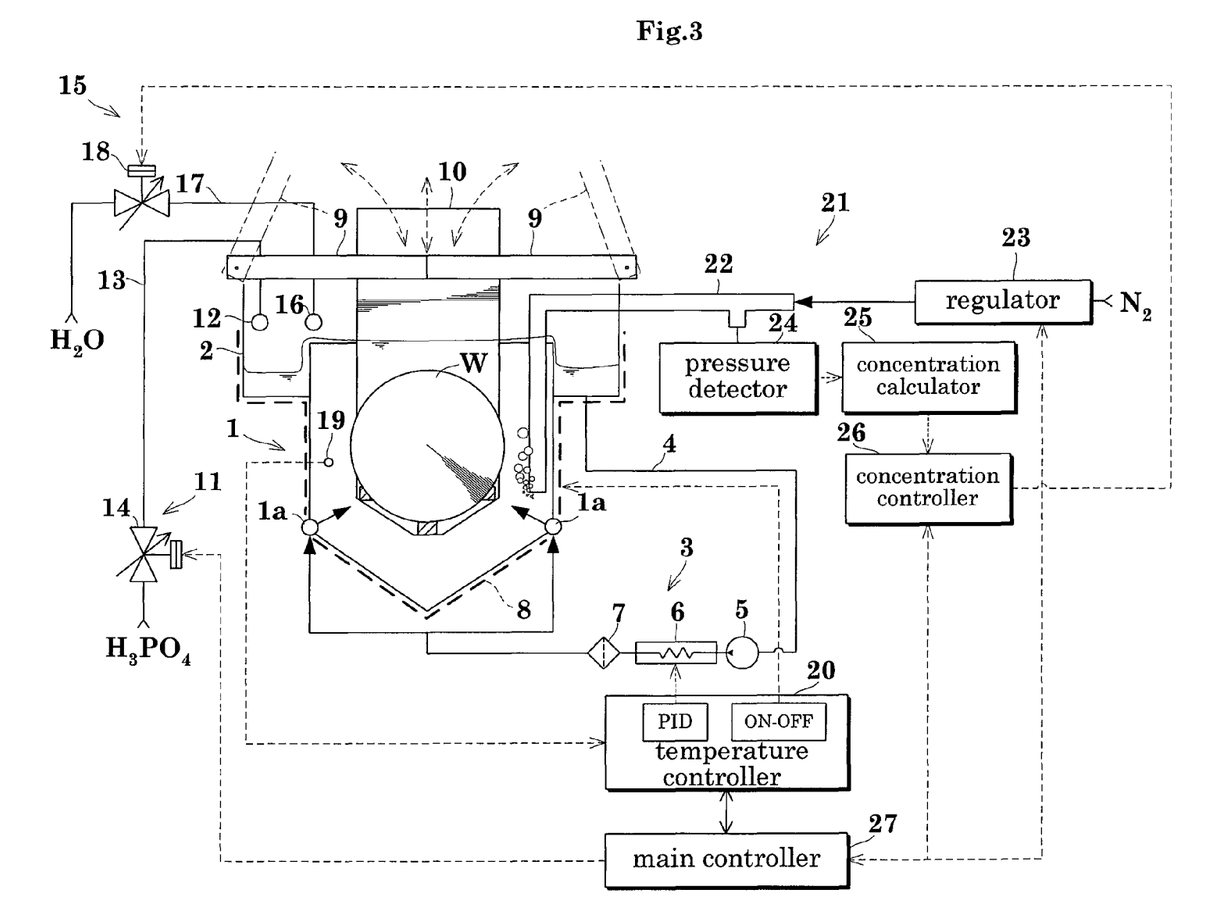
FIG. 3 is a block diagram showing an outline of a substrate treating apparatus in Embodiment 1.

FIG. 3 is a block diagram showing an outline of a substrate treating apparatus in Embodiment 1. A treating solution used in this apparatus is a phosphoric acid solution obtained by mixing phosphoric acid acting as a chemical and deionized water acting as a diluent. The phosphoric acid solution is heated, and substrates (e.g. semiconductor wafers) are immersed in the solution for etching treatment.

This substrate treating apparatus includes a treating tank 1 for storing the phosphoric acid solution. Around the treating tank 1 is a collecting tank 2 for collecting the phosphoric acid solution overflowing the treating tank 1. The phosphoric acid solution collected in the collecting tank 2 is returned to the treating tank 1 through a circulating system 3. The circulating system 3 includes piping 4 for communicating the collecting tank 2 to injection pipes 1a disposed adjacent the bottom of the treating tank 1. The piping 4 has, arranged thereon, a pump 5 for feeding the solution, a circulating system heater 6 and a filter 7. The circulating system heater 6 is used for heating the phosphoric acid solution returned to the treating tank 1. The filter 7 is provided to remove particles from the phosphoric acid solution returned to the treating tank 1. A tank heater 8 is disposed around the treating tank 1 and collecting tank 2 for heating the phosphoric acid solution in the tanks. The circulating system heater 6 and tank heater 8 correspond to the heating device in this invention.

An openable cover 9 is disposed above the treating tank 1. A plurality of wafers W under treatment are held by a vertically movable holding arm 10 as arranged in vertical posture and equidistantly thereon. The cover 9 is closed when the holding arm 10 is outside the treating tank 1. The cover 9 is opened for allowing the holding arm 10 to load the group of wafers W into the treating tank 1. While the group of wafers W undergoes etching treatment in the tank 1, the cover 9 remains closed again. These features are the same as in the conventional apparatus shown in FIG. 1.

A phosphoric acid supply device 11 is provided for supplying phosphoric acid to the collecting tank 2. The phosphoric acid supply device 11 includes a nozzle 12 disposed above the collecting tank 2, piping 13 for connecting the nozzle 12 to a phosphoric acid source, and a flow regulating valve 14 mounted on the piping 13. A deionized water supplementing device 15 is provided for supplementing deionized water to the treating tank 1. The deionized water supplementing device 15 includes a nozzle 16 disposed adjacent an edge of the treating tank 1, piping 17 for connecting the nozzle 16 to a deionized water source, and a flow regulating valve 18 mounted on the piping 17. The deionized water supplementing device 15 corresponds to the supplementing device in this invention.

The treating tank 1 includes a temperature sensor 19 for detecting the temperature of the phosphoric acid solution stored therein. A detection signal of the temperature sensor 19 is applied to a temperature controller 20. Based on this detection signal, the temperature controller 20 carries out a PID (proportional, integral and differential) control of the circulating system heater 6 and an ON/OFF control of the tank heater 8. Specifically, the temperature controller 20 controls the circulating system heater 6 so that the temperature of the phosphoric acid solution is maintained in the range of 159.7 to 160.3° C. When the temperature of the phosphoric acid solution is at or below 160.3° C., the temperature controller 20 maintains the tank heater 6 in ON state. When the temperature of the solution exceeds 160.3° C., the temperature controller 20 turns off the tank heater 6. The temperature sensor 19 corresponds to the temperature detecting device in this invention. The temperature controller 20 corresponds to the temperature control device in this invention.

Further, a concentration detecting device 21 is provided for the treating tank 1 for detecting the concentration of the phosphoric acid solution therein. Noting the fact that a correlation exists between the concentration of the phosphoric acid solution and the specific gravity thereof, the concentration detecting device 21 is arranged to detect the concentration of the phosphoric acid solution by substantially detecting the specific gravity of the solution. Since the specific gravity of the phosphoric acid solution has a correlation with a pressure at a predetermined depth in the treating tank 1, the concentration detecting device 21 has a detecting element at the predetermined depth in the treating tank 1, and detects the concentration of the phosphoric acid solution by detecting a pressure of the treating solution applied to this element. A specific construction of the concentration detecting device 21 will be described hereinafter.

The concentration detecting device 21 includes a detection pipe 22, a regulator 23, a pressure detector 24 and a concentration calculator 25. The detecting pipe 22 is formed of a fluororesin resistant to the phosphoric acid solution, and has a tip end thereof acting as the detecting element located at the predetermined depth in the treating tank 1. The regulator 23 supplies nitrogen gas from a nitrogen gas source at a constant flow rate into the detection pipe 22. In a normal state, a nitrogen gas discharge pressure may be considered nearly equal to the liquid pressure at the predetermined depth from the liquid surface in the treating tank 1. The pressure detector 24 has a pressure sensor for measuring a nitrogen gas pressure in the detection pipe 22. Thus, an output signal from the pressure detector 24 may be regarded as the liquid pressure at the predetermined depth from the liquid surface in the treating tank 1. The concentration calculator 25 has, stored therein in advance, working curve data showing a correspondence between voltage and concentration according to a pressure from the pressure detector 24. The concentration calculator 25 derives a concentration of the phosphoric acid solution in the treating tank 1 from the detection signal (voltage) received from the pressure detector 24.

A specific concentration calculating method is described in detail in Japanese Unexamined Patent Publication No. 11-219931 (1999), which, briefly, is as follows.

The detection signal (voltage) from the pressure detector 24 and the liquid pressure have a fixed functional relationship therebetween. The liquid pressure may be expressed as a sum of atmospheric pressure and a value proportional to the product of a distance (depth) from the liquid surface to the detecting element of the detection pipe 22 and the specific gravity of the phosphoric acid solution. Therefore, the liquid pressure acting on the detecting element may be expressed by a function having variables consisting in the concentration of the phosphoric acid solution and the depth of the detecting element. Thus, the concentration and depth are in a fixed relationship with the voltage outputted from the pressure detector 24. Based on this relationship, a concentration of the phosphoric acid solution may be derived from the voltage outputted from the pressure detector 24 by determining beforehand a relationship between concentration and voltage for the predetermined depth.

The above concentration detecting device 21 corresponds to the concentration detecting device in this invention.

Concentration data of the phosphoric acid solution provided by the concentration detecting device 21 is applied from the concentration calculator 25 to the concentration controller 26. The concentration controller 26 controls the deionized water flow regulating valve 18 to adjust the amount of deionized water supplemented, so that a detected concentration of the phosphoric acid solution becomes slightly higher than a boiling-point concentration corresponding to a set temperature of the phosphoric acid solution. Specifically, the concentration controller 26 controls the flow regulating valve 18 by PID (proportional, integral and differential) control, based on a detected concentration of the phosphoric acid solution.

A main controller 27 is provided to perform an overall control of the substrate treating apparatus. Specifically, the main controller 27 gives a command of a set temperature of the phosphoric acid solution to the temperature controller 20, a command of a target concentration of the phosphoric acid solution to the concentration controller 26, a control command to the phosphoric acid flow regulating valve 14, and so on.

Next, operation of this substrate treating apparatus will be described with reference to the flow chart shown in FIG. 4.

Steps S1 and S2

First, the phosphoric acid flow regulating valve 14 is opened to supply phosphoric acid to the collecting tank 2. The phosphoric acid supplied to the collecting tank 2 is heated by the circulating system heater 6 while being transmitted to the treating tank 1 through the circulating system 3. The phosphoric acid introduced into the treating tank 1 is heated also by the tank heater 8.

Steps S3, S4 and S5

The temperature of the phosphoric acid in the treating tank 1 is detected by the temperature sensor 19, and a corresponding signal is applied to the temperature controller 20. The temperature controller 20 controls the temperature of the phosphoric acid to be within ±0.3° C. of a predetermined temperature of 160° C. Specifically, when the solution temperature is below 159.7° C., the heating by the circulating system heater 6 and tank heater 8 is continued. When the solution temperature exceeds 160.3° C., the heating by the circulating system heater 6 and tank heater 8 is stopped to allow the solution temperature to lower by natural cooling. It should be noted that no deionized water is supplemented for lowering the solution temperature. This point is described in detail hereinafter. When the solution temperature is brought within the range of 159.7 to 160.3° C., the operation proceeds to step S6.

Step S6

The concentration of the solution in the treating tank 1 is detected from time to time by the concentration detecting device 21. The concentration controller 26 controls the flow regulating valve 18 by PID control to supplement the treating tank 1 with deionized water so that the detected concentration agrees with a target concentration set beforehand. This target concentration is set to be slightly higher than the boiling-point concentration corresponding to the set temperature of the phosphoric acid solution. When the detected concentration of the phosphoric acid solution in the treating tank 1 exceeds a target concentration range, the supplementing of deionized water is continued. When the detected concentration is less than the target concentration range, the supplementing of deionized water is stopped. When the supplementing of deionized water is stopped, the deionized water in the phosphoric acid solution evaporates by the heating of the phosphoric acid solution, whereby the concentration of the phosphoric acid solution increases automatically.

Steps S7, S8 and S9

When the phosphoric acid solution in the treating tank 1 is brought into and stabilizes in the target concentration range, the group of wafers W held by the holding arm 10 is loaded into the treating tank 1, and etching treatment of the wafers W is started. The temperature control and concentration control in steps S2-S6 are repeated until a predetermined treating time elapses. After the treating time, the group of wafers W is withdrawn upward from inside the tank 1 and transferred to a next treating tank.

Next, a relationship between the temperature control and concentration control of the phosphoric acid solution in this embodiment will be described with reference to FIG. 5.

Figure 5:
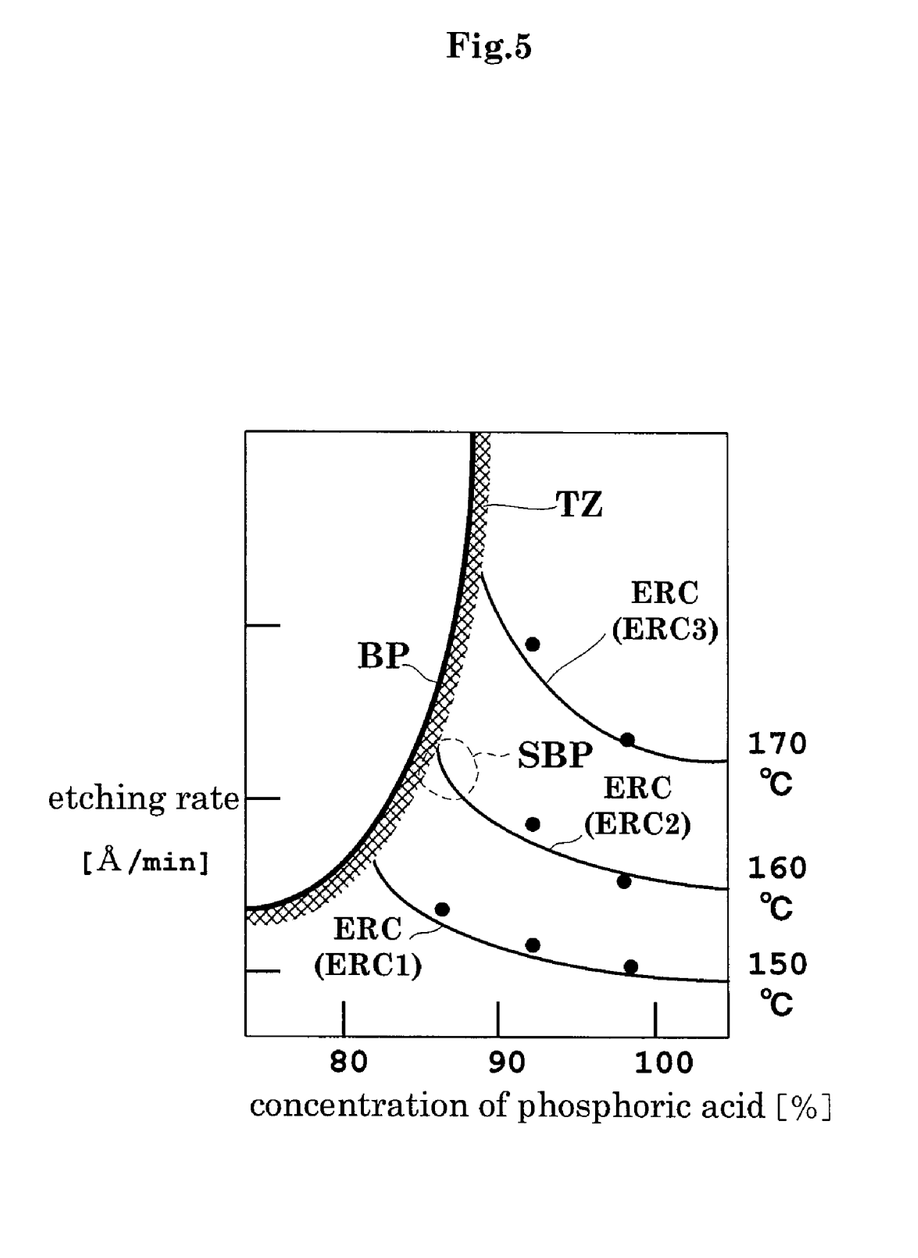
FIG. 5 is a graph showing a relationship between the concentration and temperature of a phosphoric acid solution, and a silicon nitride film etching rate.

FIG. 5 is a graph showing a relationship between the concentration and temperature of the phosphoric acid solution, and a silicon nitride film etching rate. As shown in FIG. 5, boiling point BP has a property of becoming higher with an increase in the concentration of the phosphoric acid solution. Since, in this embodiment, the temperature controller 20 performs a control to maintain the temperature of the phosphoric acid solution constant, a selected rate in time of etching silicon nitride film (etching rate) will move along an etching rate curve ERC for each temperature with variations in the concentration. Here, the temperature of 150° C. is assumed to provide curve ERC1, the temperature of 160° C. curve ERC2 and the temperature of 170° C. curve ERC3. In this embodiment, the set temperature of the phosphoric acid solution is 160° C., the concentration is variable along the curve ERC2. A concentration region slightly higher than the boiling-point concentration BP on the curve ERC2 is sub-boiling point SBP. The etching rate may be maintained highest by maintaining the concentration of the phosphoric acid solution at the sub-boiling point SBP located in a turbulence zone TZ on one side of a boundary of boiling point BP. The target concentration of the phosphoric acid solution in this embodiment is set to this sub-boiling point region.

Figure 4:
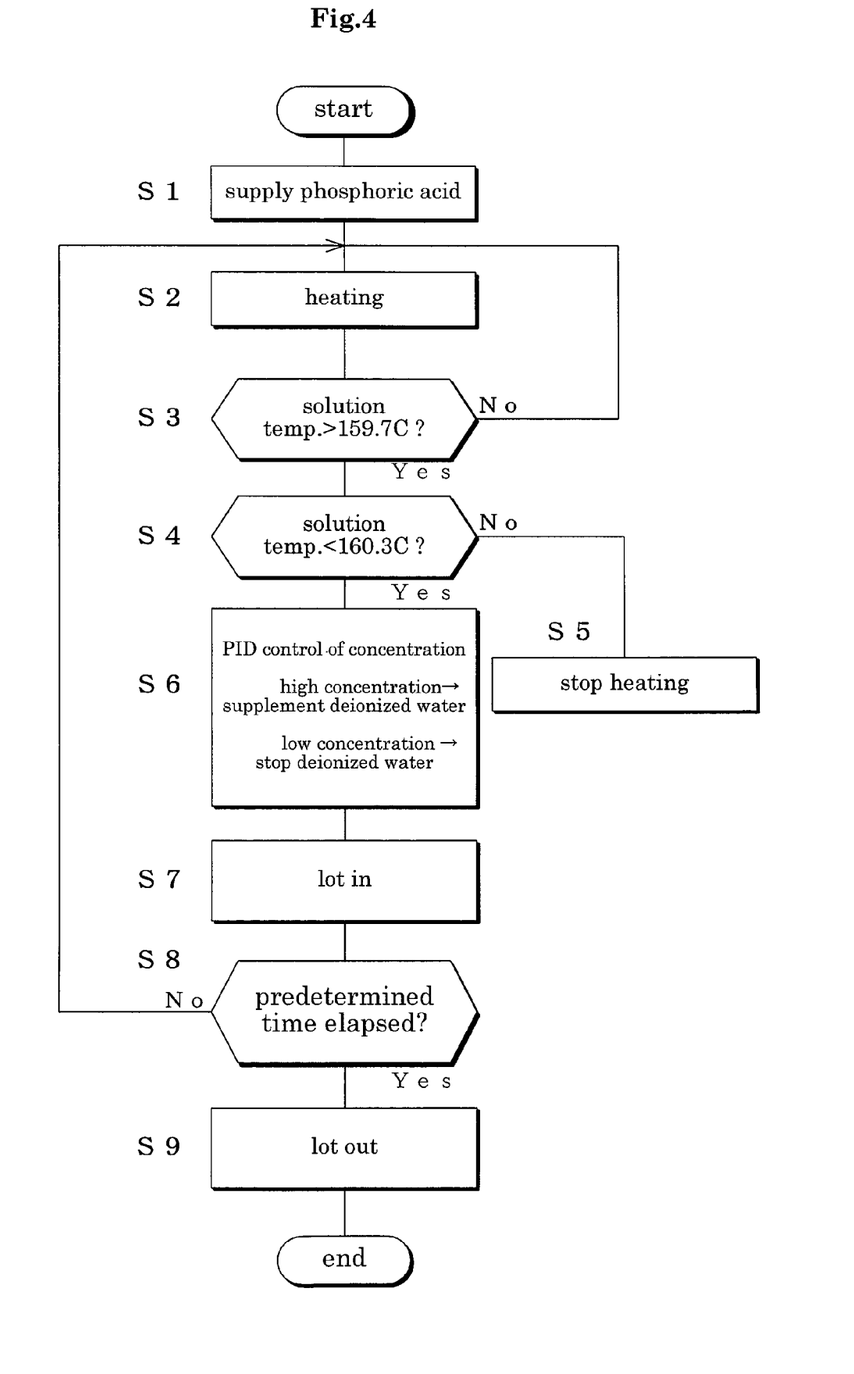
FIG. 4 is a flow chart showing a sequence of treatment.

In this embodiment, as described above, when the temperature of the phosphoric acid solution exceeds the set temperature range, the temperature of the solution is lowered by stopping the heating without supplying deionized water (step S5 in FIG. 4). Further, the concentration control is performed only when the temperature of the phosphoric acid solution is in the range of 159.7 to 160.3° C. (step S6). The reason is as follows. If deionized water is supplied in order to lower the temperature of the phosphoric acid solution having risen to 170° C., for example, the concentration of the phosphoric acid solution will vary leftward along the curve ERC3 in FIG. 5 (in the direction in which the concentration lowers). Then, the phosphoric acid solution could reach the boiling point BP to cause bumping before reaching the target concentration (sub-boiling point SBP on the curve ERC2 in FIG. 5) corresponding to the set temperature. In order to avoid bumping, it is necessary to supplement deionized water gradually. Then, a long time will be taken to bring the phosphoric acid solution to the set temperature.

In this embodiment, however, since the temperature of the phosphoric acid solution is controlled only by operation of the circulating system heater 6 and the tank heater 8, the concentration of the phosphoric acid solution remains unchanged even if the temperature of the phosphoric acid solution is varied. This precludes the possibility of bumping of the phosphoric acid solution. The supplementing of deionized water for adjusting the concentration of the phosphoric acid solution is performed only when the temperature of the phosphoric acid solution is in the set temperature range. Thus, this embodiment is free from bumping due to the supplementing of deionized water.

According to this embodiment, as described above, when the concentration of the phosphoric acid solution is higher than the target concentration, deionized water is supplemented to lower the concentration along the curve ERC2 corresponding to the set temperature of the phosphoric acid solution. Conversely, when the concentration of the phosphoric acid solution is lower than the target concentration, no deionized water is supplemented and the concentration is increased by evaporation of the deionized water from the phosphoric acid solution heated. In this way, the concentration of the phosphoric acid solution is maintained at the sub-boiling point with high precision, thereby maintaining a high etching rate of the phosphoric acid solution.

As described above, the concentration control in steps S3-S6 is carried out only when the solution temperature is in the predetermined range. A specific example of variations in the temperature and concentration (specific gravity) occurring in time of the concentration control will be described with reference to FIG. 6.

Figure 6A:
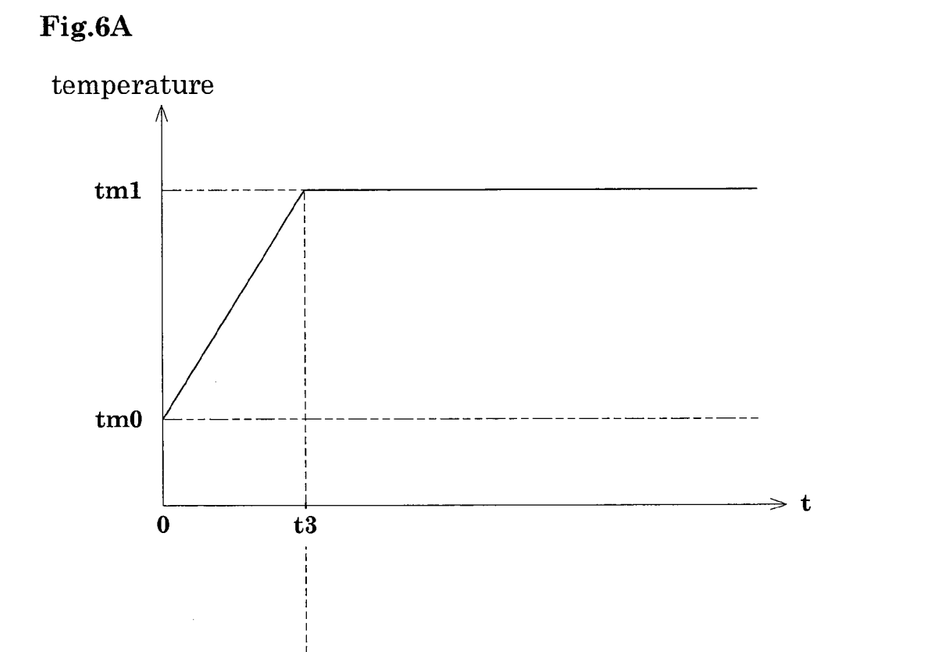
FIG. 6A shows temperature variations and FIG. 6B shows concentration variations.
Figure 6B:
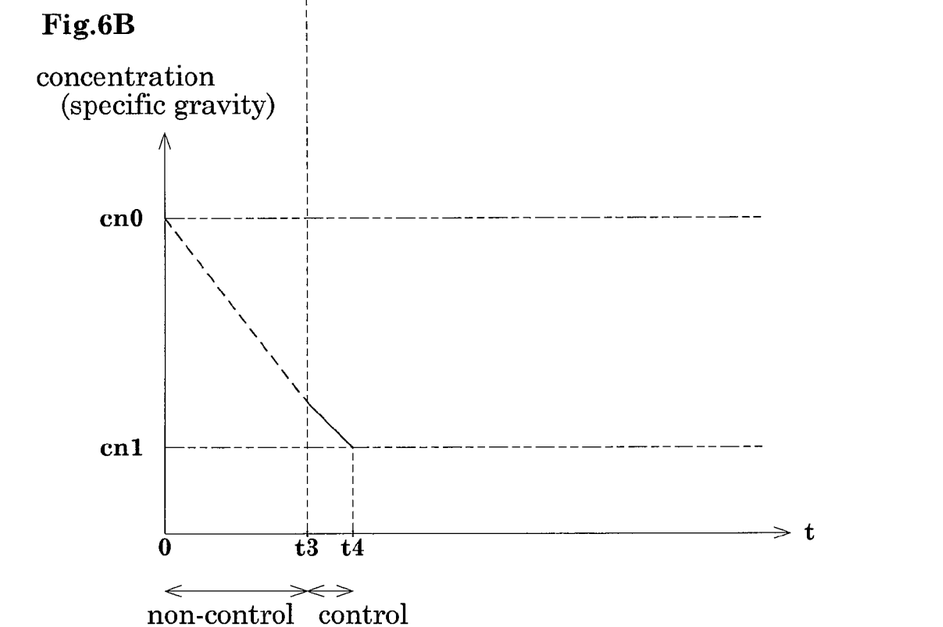

In this example, as shown in FIG. 6A, heating is started at time t=0 when the temperature is tm0, to raise the temperature to tm1. On the other hand, as shown in a dotted line in FIG. 6B, the concentration, in a non-control state with no deionized water supplemented, lowers from cn0 with the temperature increase. Assume the temperature reaches the predetermined range at time t3. Then, the concentration control is started to attain a set concentration cn1. By starting the concentration control after the temperature reaches the predetermined range, it is possible to avoid adverse influences of variations in the concentration due to the temperature control and to consume a less time than in the prior art before time t4 when the set concentration is attained.

Embodiment 2

Figure 7:
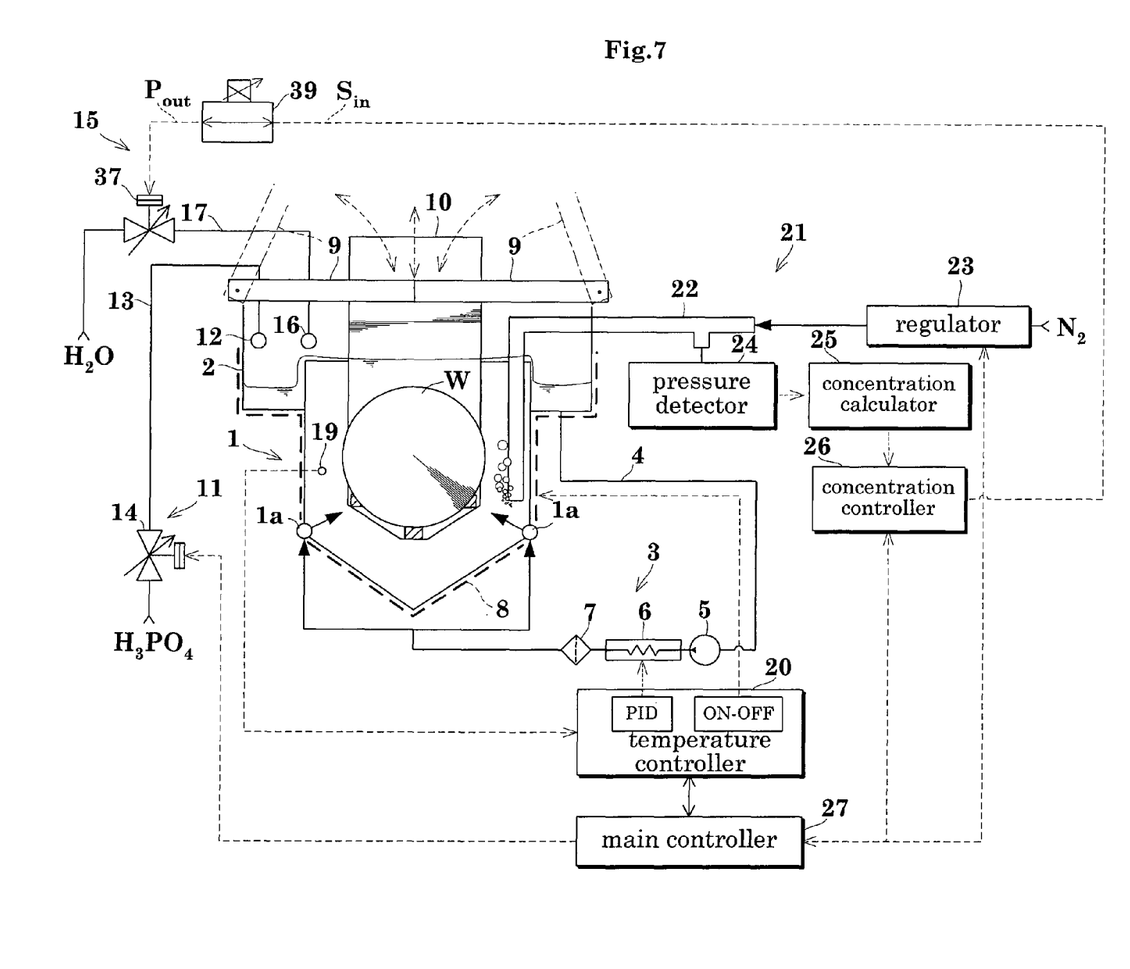
FIG. 7 is a block diagram showing an outline of a substrate treating apparatus in Embodiment 2.

FIG. 7 is a block diagram showing an outline of a substrate treating apparatus in Embodiment 2 of this invention. Like reference numerals are used to identify like parts in this embodiment which are the same as in Embodiment 1, and will not be described again.

As in Embodiment 1, this substrate treating apparatus includes a treating tank 1 for storing the phosphoric acid solution, a collecting tank 2 for collecting the overflowing phosphoric acid solution, a circulating system 3 and so on.

A deionized water supplementing device 15 includes a nozzle 16 disposed adjacent an edge of the treating tank 1, piping 17 for connecting the nozzle 16 to a deionized water source, and an air control valve 37 mounted on the piping 17.

Figure 8:
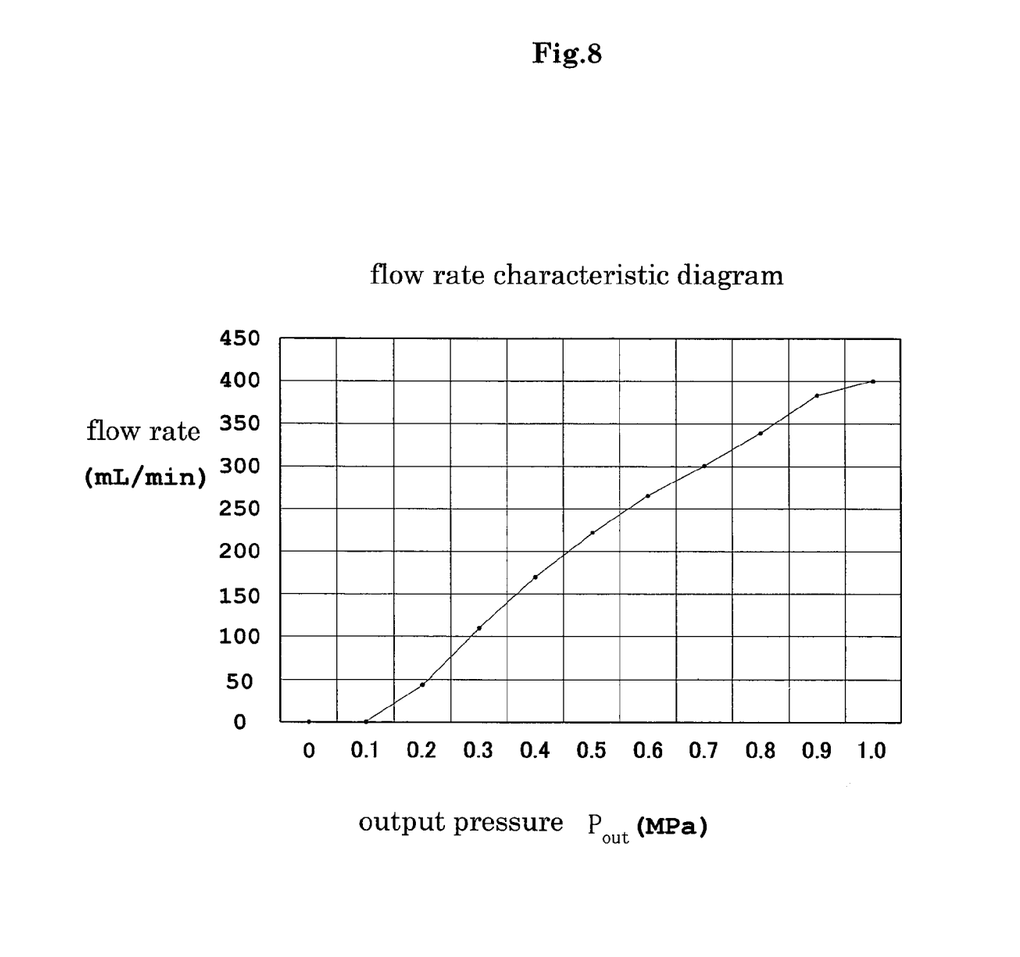
FIG. 8 is a graph showing flow rate characteristics of an air control valve.

An electropneumatic converter 39 applies an output pressure $P_{out}$ to the air control valve 37 to adjust a cross-sectional passage area thereof, thereby to adjust a deionized water flow rate through the piping 35 with high precision. The electropneumatic converter 39 is also called an electropneumatic regulator, and converts compressed air of predetermined pressure applied thereto into the output pressure $P_{out}$ according to an input signal $S_{in}$. As the input signal $S_{in}$, for example, 4 to 20 [mA] are applied, and the output pressure $P_{out}$ is adjusted to 0-1.0 [MPa] in response thereto. Upon receipt of the output pressure $P_{out}$, the air control valve 37 adjusts the deionized water flow rate through the piping 17 to 0 to 400 [L/min]. FIG. 8 is a flow rate characteristic diagram showing such characteristic of the air control valve 37. As seen from this characteristic diagram, the deionized water flow rate is linearly adjusted by the air control valve 37 according to the output pressure $P_{out}$ from the electropneumatic converter 39. The input signal $S_{in}$ is applied to the electropneumatic converter 39 from a concentration controller 55 described hereinafter.

Concentration data of the phosphoric acid solution obtained with a concentration detecting device 21 is applied to the concentration controller 55. The concentration controller 55 controls the electropneumatic converter 39 to adjust the air control valve 37 so that the detected concentration of the phosphoric acid solution is slightly higher than the boiling-point concentration corresponding to the set temperature of the phosphoric acid solution. As a result, the amount of deionized water supplied from the nozzle 16 to the treating tank 1 is adjusted. Specifically, the concentration controller 55 controls the electropneumatic converter 39 by PID (proportional, integral and differential) control, based on the detected concentration of the phosphoric acid solution.

Operation of this substrate treating apparatus is different from the operation in Embodiment 1 in the control executed in step S6.

That is, the concentration of the solution in the treating tank 1 is detected from time to time by the concentration detecting device 21. The concentration controller 55 controls the air control valve 37 by adjusting the input signal $S_{in}$ to the electropneumatic converter 39 by PID control to supplement deionized water to the treating tank 1, so that the detected concentration agrees with a predetermined target concentration. This target concentration is set to be slightly higher than the boiling-point concentration corresponding to the set temperature of the phosphoric acid solution. When the detected concentration of the phosphoric acid solution in the treating tank 1 exceeds a target concentration range, the supplementing of deionized water is continued. When the detected concentration is less than the target concentration range, the supplementing of deionized water is stopped. When the supplementing of deionized water is stopped, the deionized water in the phosphoric acid solution evaporates by the heating of the phosphoric acid solution, whereby the concentration of the phosphoric acid solution increases automatically.

In this way, the electropneumatic converter 39 can vary the output pressure $P_{out}$ linearly according to the input signal $S_{in}$ received from the concentration controller 55. By operating the air control valve 37 based on the input signal $S_{in}$, the amount of deionized water supplemented may be adjusted linearly. Thus, deionized water may be supplemented accurately according to the concentration detected by the concentration detecting device 21.

The relationship between the temperature control and concentration control of the phosphoric acid solution in Embodiment 2 is the same as in Embodiment 1 described above.

Deionized water is supplemented for adjusting the concentration of the phosphoric acid solution only when the temperature of the phosphoric acid solution is in the set temperature range. Thus, the supplementing of the deionized water never causes bumping. Moreover, deionized water is supplemented by adjusting the output pressure $P_{out}$ of the electropneumatic converter 39 to control the air control valve 37. This realizes a high etching rate of the treating solution maintained accurately while preventing bumping.

According to this embodiment, as described above, when the concentration of the phosphoric acid solution is higher than target concentration, deionized water is supplemented to lower the concentration along the curve (ERC2) corresponding to the set temperature of the phosphoric acid solution. Conversely, when the concentration of the phosphoric acid solution is lower than the target concentration, no deionized water is supplemented and the concentration is increased by evaporation of the deionized water from the phosphoric acid solution heated. In this way, the concentration of the phosphoric acid solution is maintained at the sub-boiling point with high precision, thereby maintaining a high etching rate of the phosphoric acid solution.

This invention is not limited to the foregoing embodiments, but may be modified as follows:

(1) Embodiments 1 and 2 have been described by taking the phosphoric acid solution as an example of treating solution. This invention is applicable also where a different treating solution such as a sulfuric acid solution is used.

(2) In Embodiments 1 and 2 described above, the concentration of the treating solution is adjusted to be slightly higher than the boiling-point concentration corresponding to the set temperature of the treating solution. This invention is applicable to any substrate treating apparatus that supplies a chemical solution and deionized water to a treating tank without such a control.

(3) This invention is applicable also to an apparatus not having a circulating pipe system as described hereinbefore for circulating a treating solution.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for heating a treating solution formed of a chemical and a diluent, and immersing substrates in the treating solution for treatment, said method comprising:
    a) a step of storing the treating solution in a treating tank;
    b) a step of heating the treating solution with a heating device;
    c) a step of detecting a temperature of the treating solution with a temperature detecting device, repeating the heating step until the temperature of the treating solution exceeds a lower limit of a set temperature range, and proceeding to step (d) only when the temperature of the treating solution exceeds the lower limit of said set temperature range;
    d) a step of detecting the temperature of the treating solution with the temperature detecting device, and proceeding to step (e) only when the temperature of the treating solution is below an upper limit of said set temperature range;
    e) a step of controlling a supplementing device, when the treating solution is in said set temperature range, to adjust an amount of a diluent supplemented to said treating tank so that a concentration of the treating solution detected by a concentration detecting device becomes a predetermined target concentration; and
    f) treating the substrates through contact with the treating solution having been adjusted to the set temperature range and having been adjusted to the target concentration.

2. The method according to claim 1, wherein the treating solution is heated by a circulating system heater in a circulating system for returning to said treating tank the treating solution discharged from said treating tank, and by a tank heater attached to the treating tank.

3. The method according to claim 1, wherein said supplementing device supplements the diluent when the concentration of the treating solution detected by said concentration detecting device exceeds the target concentration, and supplementation of the diluent by said supplementing device is stopped when the concentration of the treating solution is lower than the target concentration.

4. The method according to claim 3, wherein said target concentration is set slightly higher than a boiling point concentration corresponding to the set temperature range of the treating solution.

5. The method according to claim 1, wherein said treating solution is a liquid mixture of phosphoric acid acting as the chemical and deionized water acting as the diluent.

* * * * *